(12) United States Patent
Lai

(10) Patent No.: US 9,151,596 B2
(45) Date of Patent: Oct. 6, 2015

(54) POSITION CHECKING DEVICE OF LED OF LED LIGHT BAR

(75) Inventor: Chih-Chen Lai, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 477 days.

(21) Appl. No.: 13/600,141

(22) Filed: Aug. 30, 2012

(65) Prior Publication Data

US 2013/0235187 A1   Sep. 12, 2013

(51) Int. Cl.
*G01B 11/14* (2006.01)
*H05K 3/34* (2006.01)

(52) U.S. Cl.
CPC .............. *G01B 11/14* (2013.01); *H05K 3/341* (2013.01); *H05K 2201/10106* (2013.01); *H05K 2203/163* (2013.01); *H05K 2203/166* (2013.01); *H05K 2203/167* (2013.01)

(58) Field of Classification Search
None
See application file for complete search history.

(56) References Cited

U.S. PATENT DOCUMENTS

| | | | |
|---|---|---|---|
| 4,704,525 A * | 11/1987 | Shimaoka et al. | 250/239 |
| 6,819,214 B2 * | 11/2004 | Elliott et al. | 336/229 |
| 6,880,243 B2 * | 4/2005 | Ireland | 29/840 |
| 6,894,314 B2 * | 5/2005 | Musk | 257/80 |
| 6,949,733 B2 * | 9/2005 | Widdowson et al. | 250/221 |
| 8,801,228 B2 * | 8/2014 | Suen et al. | 362/268 |
| 2002/0085390 A1 * | 7/2002 | Kiyomoto et al. | 362/555 |
| 2006/0146576 A1 * | 7/2006 | Fukasawa et al. | 362/631 |
| 2007/0045524 A1 * | 3/2007 | Rains et al. | 250/228 |
| 2011/0266574 A1 * | 11/2011 | Liao et al. | 257/98 |
| 2013/0242549 A1 * | 9/2013 | Lai | 362/221 |
| 2013/0318777 A1 * | 12/2013 | Hu et al. | 29/593 |
| 2014/0173886 A1 * | 6/2014 | Lai | 29/593 |
| 2014/0204398 A1 * | 7/2014 | Sato et al. | 356/614 |

FOREIGN PATENT DOCUMENTS

JP    2012238410 A  * 12/2012

* cited by examiner

*Primary Examiner* — Gordon J Stock, Jr.
(74) *Attorney, Agent, or Firm* — Novak Druce Connolly Bove + Quigg LLP

(57) ABSTRACT

A checking device of an SMT placement machine for checking positions of LEDs mounted on a circuit board includes a shell, a light source and an imaging module. The shell is used for covering the LEDs and the circuit board to be checked. The shell includes an opening and an atomized reflecting layer facing the LEDs. The opening is defined for exposing the LEDs through the shell to the imaging module whereby images of the LEDs can be taken by the imaging module and positions of the LEDs can be checked thereby. The atomized reflecting layer is formed on an inner surface of the shell. The light source is covered by the shell and faces the atomized reflecting layer. The imaging module is aligned with the opening.

12 Claims, 3 Drawing Sheets

POSITION CHECKING DEVICE OF LED OF LED LIGHT BAR

BACKGROUND

1. Technical Field

The present disclosure generally relates to checking devices, and particularly to checking devices of surface mount technology (SMT) placement machines for checking positions of light emitting diodes (LEDs) mounted on a circuit board for constructing an LED light bar.

2. Description of Related Art

Recently, LED light bars are widely used for illumination and backlight display. Generally, LED light bars are constituted of a plurality of LEDs soldered on a circuit board and aligned in a straight line. Due to that the LEDs are firstly placed on the circuit board by an SMT placement machine and adhered to the circuit board by solder before the reflow soldering process, the LEDs are easily shifted from the predetermined positions when the solder is molten into liquid state during the reflow soldering process. Thus, it is an important issue to check an alignment of the LEDs on the circuit board after the SMT machine has placed the LEDs on the circuit board.

Therefore, it is necessary to provide a checking device of the SMT placement machine for checking an alignment of the LEDs mounted on the circuit board for constructing an LED light bar.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe exemplary embodiments of the present checking device of an SMT placement machine for LED light bar.

Figure 1:
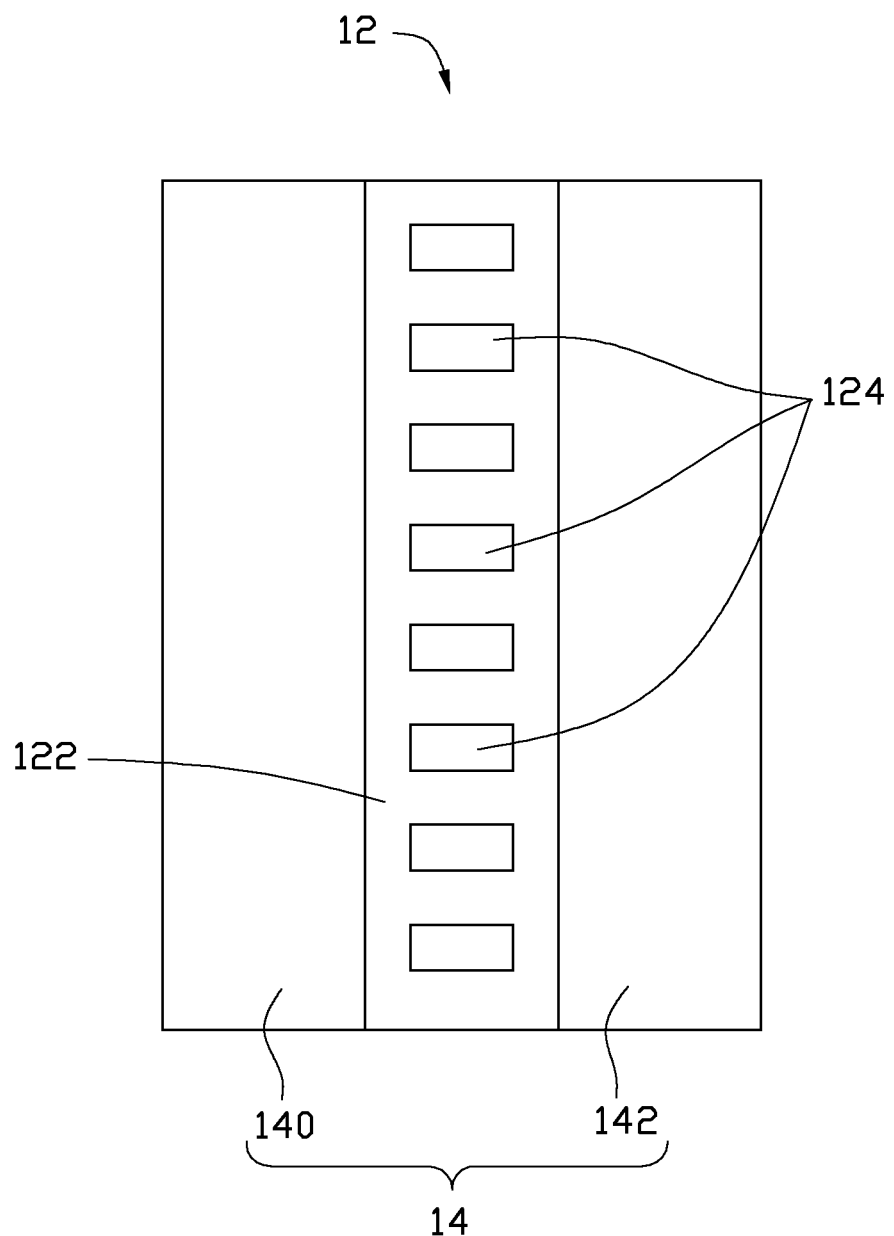
FIG. 1 is a schematic, top view of an LED light bar together with light sources of a checking device of an SMT placement machine in accordance with an embodiment of the present disclosure.
Figure 2:
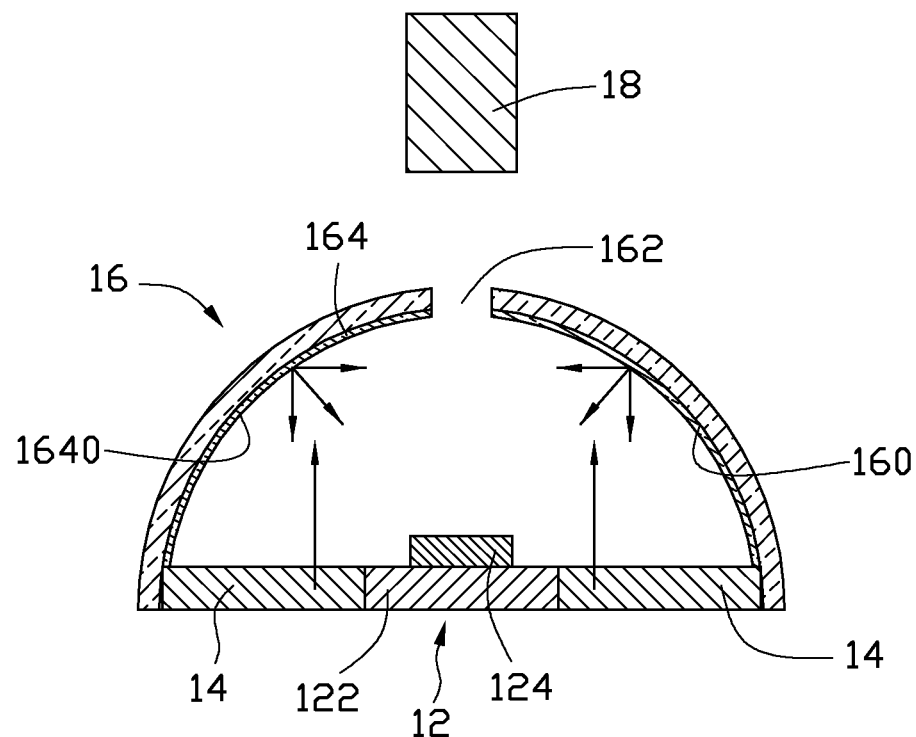
FIG. 2 is a schematic, cross section view of the checking device of an SMT placement machine together with the light bar of FIG. 1.

Referring to FIG. 1 and FIG. 2, a checking device 10 of an SMT placement machine for LED light bar, in accordance with an exemplary embodiment of present disclosure, includes a light source 14, a shell 16 and an imaging module 18, which is an optical device, for example, a CCD (charge-coupled device) for checking a position of an LED of a light bar by detecting an image of the LED. The checking device 10 of an SMT placement machine is for checking an alignment of the SMDs 124, such as surface mount type LEDs, mounted on a circuit board 122. In this embodiment, the SMDs 124 and the circuit board 122 are together designated as a component 12 to be tested.

The SMDs 124 are placed at intended positions on the circuit board 122 by a vacuum pick-up of an SMT placement machine (not illustrated) and adhered to the circuit board 122 by solder paste. In this embodiment, the component 12 to be tested is an LED light bar, the circuit board 122 is designated as rectangular, and the SMDs 124 are designated as LED dies. The checking device 10 of an SMT placement machine is configured for checking whether there is any shift of SMDs 124 from their intended positions.

The light source 14 can be LED lamps, incandescent lamps, halogen lamps, fluorescent lamps, or mercury lamps. In this embodiment, the light source 14 is designated as two light emitting parts 140, 142 arranged parallel to each other. The two parallel light emitting parts 140 and 142 defines a space therebetween for accommodating the circuit board 122 on which the SMDs 124 are mounted. When the SMDs 124 and the circuit board 122 are arranged between the two light emitting parts 140 and 142, the two light emitting parts 140, 142 are capable of limiting a movement of the circuit board 122 in lateral directions, thereby making the circuit board 122 being precise at position during the check of the positions of the SMDs 124.

The shell 16 is arranged for covering the circuit board 122 and the SMDs 124 to be checked. The shell 16 is hollow with an inner surface 160, an opening 162 in a top of the shell 16, and an atomized reflecting layer 164 formed on the inner surface 160.

The opening 162 is for exposing the circuit board 122 and the SMDs 124 covered by the shell 16 to be exposed upwardly to the imaging module 18. In this embodiment, the shell 16 has a hollow, arced (preferably semicircular) shape, and the opening 162 is defined on a central apex of the shell 16. When the SMDs 124 and the circuit board 122, which constitute the component 12 to be checked, they are arranged between the two light emitting parts 140 and 142, and the opening 162 is directly above the component 12, thereby exposing the component 12 to an exterior of the shell 16 via the opening 162.

The atomized reflecting layer 164 is configured for reflecting and diffusing light emitted from the light source 14. The light source 14 is arranged underneath the shell 16 and facing the atomized reflecting layer 164. Thereby, the light source 14 is covered by the shell 16 and the light source 14 can emit light toward the atomized reflecting layer 164, rather than directly out of the shell 16 via the opening 162. The atomized reflecting layer 164 is made of light reflective materials, as such the atomized reflecting layer 164 can reflect the light emitted from the light source 14. The atomized reflecting layer 164 further includes a roughed outer surface 1640 facing the light source 14, as such the atomized reflecting layer 164 can diffuse the light emitted from the light source 14. In this embodiment, the atomized reflecting layer 164 can be made of titanium dioxide ($TiO_2$) which has a relatively high reflectivity.

The imaging module 18 is arranged directly above the shell 16 and aligned with the opening 162. As such, the imaging module 18 is capable of taking images of the the SMDs 124 on the circuit board 122 from above to decide their positions, thereby checking whether there is any shift of SMDs 124 from their intended positions.

Figure 3:
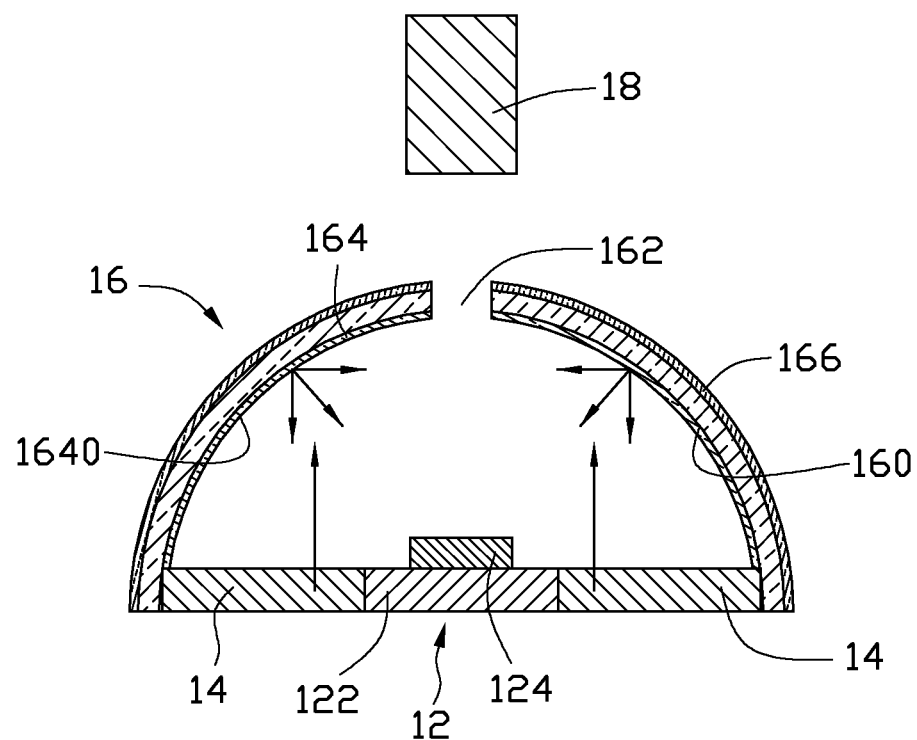
FIG. 3 is a view similar to FIG. 2, showing a checking device of an SMT in accordance with an alternative embodiment of the present disclosure.

It is to be said that, the shell 16 of the checking device 10 can be made of opaque materials, thereby avoiding ambient light to penetrate therethrough to reach the SMDs 124. Such ambient light (environment light) if reaches the SMDs 124 can affect the images of the SMDs, whereby the images caught by the imaging module 18 can lose their accuracies. In alterative embodiment, the shell 16 of a checking device 20 can also be made of light transmissive materials, with a light reflecting film 166 coated on an outer surface thereof, as illustrated in FIG. 3, for preventing ambient light from entering the space enclosed by the shell 16.

Due to that the light source 14 is covered by the shell 16 and faces the atomized reflecting layer 164, light emitted from the light source 14 travels upward toward the atomized reflecting layer 164 rather than directly out of the shell 16 via the opening 162, and the atomized reflecting layer 164 can reflect and diffuse the light towards various different directions. As such, almost all of the light from the light source 14 will be directed to illuminate the SMDs 124 and the circuit board 122 with a high brightness, and the light from various directions can finally illuminate the SMDs 124 and the circuit board 122 uniformly. Furthermore, the shell 16 covers the light source 14, the SMDs 124 and the circuit board 122, thereby preventing ambient light from entering the shell 16 and influencing the images of the SMDs 124 taken by the imaging module 18.

Accordingly, the above mentioned checking device 10 of an SMT placement machine can effectively taking high quality photographs of the SMDs 124 on the circuit board 122 to decide their positions with high accuracies, thereby checking whether there is any shift of SMDs 124 from their intended positions.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A checking device of an SMT placement machine for checking positions of light emitting devices mounted on a circuit board, comprising:
    an imaging module;
    a shell for covering the light emitting devices and the circuit board to be tested, the shell having an opening over the light emitting devices and an atomized reflecting layer facing the light emitting devices, the opening being defined for exposing the light emitting devices to the imaging module whereby the imaging module can take images of the light emitting devices to decide the positions of the light emitting devices, the atomized reflecting layer being formed on an inner surface of the shell; and
    a light source covered by the shell and facing the atomized reflecting layer, light generated by the light source being reflected and diffused by the atomized reflecting layer toward the light emitting devices whereby the images of the light emitting devices are precisely caught by the imaging module.

2. The checking device of an SMT placement machine of claim 1, wherein the atomized reflecting layer is made of light reflecting material with a roughed surface facing the light source.

3. The checking device of an SMT placement machine of claim 1, wherein the shell is made of light transmissive material with a light reflecting film coated on an outside thereof facing away from the light source.

4. The checking device of an SMT placement machine of claim 1, wherein the shell is made of opaque material.

5. The checking device of an SMT placement machine of claim 1, wherein the imaging module is a charge-coupled device (CCD).

6. The checking device of an SMT placement machine of claim 1, wherein the light source is located beside the circuit board.

7. The checking device of an SMT placement machine of claim 1, wherein the light emitting devices are light emitting diodes (LEDs).

8. The checking device of an SMT placement machine of claim 1, wherein the shell has an arced shape with the opening defined in an apex thereof.

9. The checking device of an SMT placement machine of claim 6, wherein the light source comprises two light emitting parts parallel to each other and located at two opposite lengthwise sides of the circuit board, respectively.

10. The checking device of an SMT placement machine of claim 7, wherein the LEDs and the circuit board together form an LED light bar.

11. The checking device of an SMT placement machine of claim 8, wherein the shell has a semicircular shape.

12. The checking device of an SMT placement machine of claim 8, wherein the light source is located directly underneath the shell, whereby the light generated by the light source emits toward the atomized reflecting layer rather than directly out of the shell via the opening.

\* \* \* \* \*